(12) United States Patent
Honma

(10) Patent No.: US 12,385,136 B2
(45) Date of Patent: Aug. 12, 2025

(54) APPARATUS FOR PERFORMING FILM FORMING PROCESS ON SUBSTRATE, AND METHOD OF EXHAUSTING PROCESSING GAS FROM APPARATUS FOR PERFORMING FILM FORMING PROCESS ON SUBSTRATE

(71) Applicant: Tokyo Electron Limited, Tokyo (JP)

(72) Inventor: Manabu Honma, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 367 days.

(21) Appl. No.: 17/821,486

(22) Filed: Aug. 23, 2022

(65) Prior Publication Data

US 2023/0069624 A1 Mar. 2, 2023

(30) Foreign Application Priority Data

Aug. 27, 2021 (JP) ................. 2021-139042

(51) Int. Cl.
*C23C 16/455* (2006.01)
*C23C 16/44* (2006.01)
*C23C 16/458* (2006.01)

(52) U.S. Cl.
CPC .... *C23C 16/45551* (2013.01); *C23C 16/4412* (2013.01); *C23C 16/45574* (2013.01); *C23C 16/45578* (2013.01); *C23C 16/4584* (2013.01)

(58) Field of Classification Search
CPC ........ C23C 16/45551; C23C 16/45574; C23C 16/402; C23C 16/4412; C23C 16/45578; C23C 16/4584
See application file for complete search history.

(56) References Cited

U.S. PATENT DOCUMENTS

| | | | |
|---|---|---|---|
| 7,153,542 B2 * | 12/2006 | Nguyen | H01L 21/6719 204/192.12 |
| 9,683,290 B2 * | 6/2017 | Honma | C23C 16/4409 |
| 2010/0116209 A1 * | 5/2010 | Kato | C23C 16/45551 118/730 |
| 2015/0140786 A1 * | 5/2015 | Kwak | C23C 16/45551 118/728 |
| 2017/0130333 A1 * | 5/2017 | Miura | C23C 16/45544 |
| 2018/0195172 A1 * | 7/2018 | Tatsuoka | C23C 16/45576 |

(Continued)

FOREIGN PATENT DOCUMENTS

JP 2018-056300 A 4/2018

*Primary Examiner* — Aiden Lee
(74) *Attorney, Agent, or Firm* — Armstrong Teasdale LLP

(57) ABSTRACT

An apparatus for performing a film forming process on a substrate, includes a rotary table, a separation region including a separation gas supply configured to supply a separation gas and a main ceiling surface configured to form a separation gas gap for the separation gas, a central region including a central ceiling surface arranged around the rotation center, a rotary shaft exhaust passage made of a tubular body and connected to the rotary table to rotate the rotary table about the rotation center, the rotary shaft exhaust passage having an exhaust path formed therein, a ceiling surface side exhaust passage formed to vertically penetrate a member constituting the central region, a first exhaust port configured to exhaust the first processing gas to one of the two exhaust passages, and a second exhaust port configured to exhaust the second processing gas to the other one of the two exhaust passages.

8 Claims, 8 Drawing Sheets

(56) References Cited

U.S. PATENT DOCUMENTS

| | | | |
|---|---|---|---|
| 2021/0123138 A1* | 4/2021 | Choi | C23C 16/4583 |
| 2022/0230896 A1* | 7/2022 | Mori | H01L 21/67017 |
| 2023/0062671 A1* | 3/2023 | Taguchi | H01L 21/67748 |
| 2023/0257877 A1* | 8/2023 | Hayashi | C23C 16/4585 |
| | | | 427/255.5 |

* cited by examiner

APPARATUS FOR PERFORMING FILM FORMING PROCESS ON SUBSTRATE, AND METHOD OF EXHAUSTING PROCESSING GAS FROM APPARATUS FOR PERFORMING FILM FORMING PROCESS ON SUBSTRATE

CROSS-REFERENCE TO RELATED APPLICATION

This application is based upon and claims the benefit of priority from Japanese Patent Application No. 2021-139042, filed on Aug. 27, 2021, the entire contents of which are incorporated herein by reference.

TECHNICAL FIELD

The present disclosure relates to an apparatus for performing a film forming process on a substrate, and a method of exhausting a processing gas from an apparatus for performing a film forming process on a substrate.

BACKGROUND

As one of the methods of forming a thin film on a semiconductor wafer (hereinafter referred to as a "wafer") which is a substrate, there is known an ALD (Atomic Layer Deposition) method in which a raw material gas and a reaction gas are sequentially supplied to the surface of the wafer to stack a reaction product. As a film forming apparatus that performs a film forming process using this ALD method, there is known, for example, a configuration in which a rotary table for arranging a plurality of wafers in a circumferential direction and revolving the wafers is provided in a vacuum container. In this configuration, the rotation of the rotary table causes the wafers to pass through a raw material gas supply region and a reaction gas supply region repeatedly and alternately, thereby forming a thin film on each of the wafers.

PRIOR ART DOCUMENTS

Patent Document

Japanese Laid-Open Publication No. 2018-56300

SUMMARY

According to one embodiment of the present disclosure, an apparatus for performing a film forming process on a substrate includes: a rotary table provided in a vacuum container, configured to support a plurality of substrates on one surface side thereof, and configured to rotate about a rotation center to revolve the substrates around the rotation center; a separation region configured to separate an atmosphere in a first processing region to which a first processing gas to be adsorbed on the substrate is supplied and an atmosphere in a second processing region to which a second processing gas for reacting with the first processing gas to form a thin film on a surface of the substrate is supplied, and provided to be located between the first processing region and the second processing region in the rotation direction, the separation region including a separation gas supply configured to supply a separation gas and a main ceiling surface located on both sides of the separation gas supply in the rotation direction and configured to form a separation gas gap for the separation gas to flow between the rotary table and the main ceiling surface; a central region including a central ceiling surface arranged around the rotation center to form a central gap communicating with the separation gas gap between the rotary table and the central ceiling surface to separate the atmosphere in the first processing region and the atmosphere in the second processing region; a rotary shaft exhaust passage made of a tubular body and connected to the rotary table to rotate the rotary table about the rotation center, the rotary shaft exhaust passage having an exhaust path formed therein; a ceiling surface side exhaust passage formed so as to vertically penetrate a member constituting the central region; a first exhaust port configured to exhaust the first processing gas discharged from the first processing region to one of the rotary shaft exhaust passage and the ceiling surface side exhaust passage; and a second exhaust port configured to exhaust the second processing gas discharged from the second processing region to the other one of the rotary shaft exhaust passage and the ceiling surface side exhaust passage.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment of Film Forming Apparatus

Figure 1:
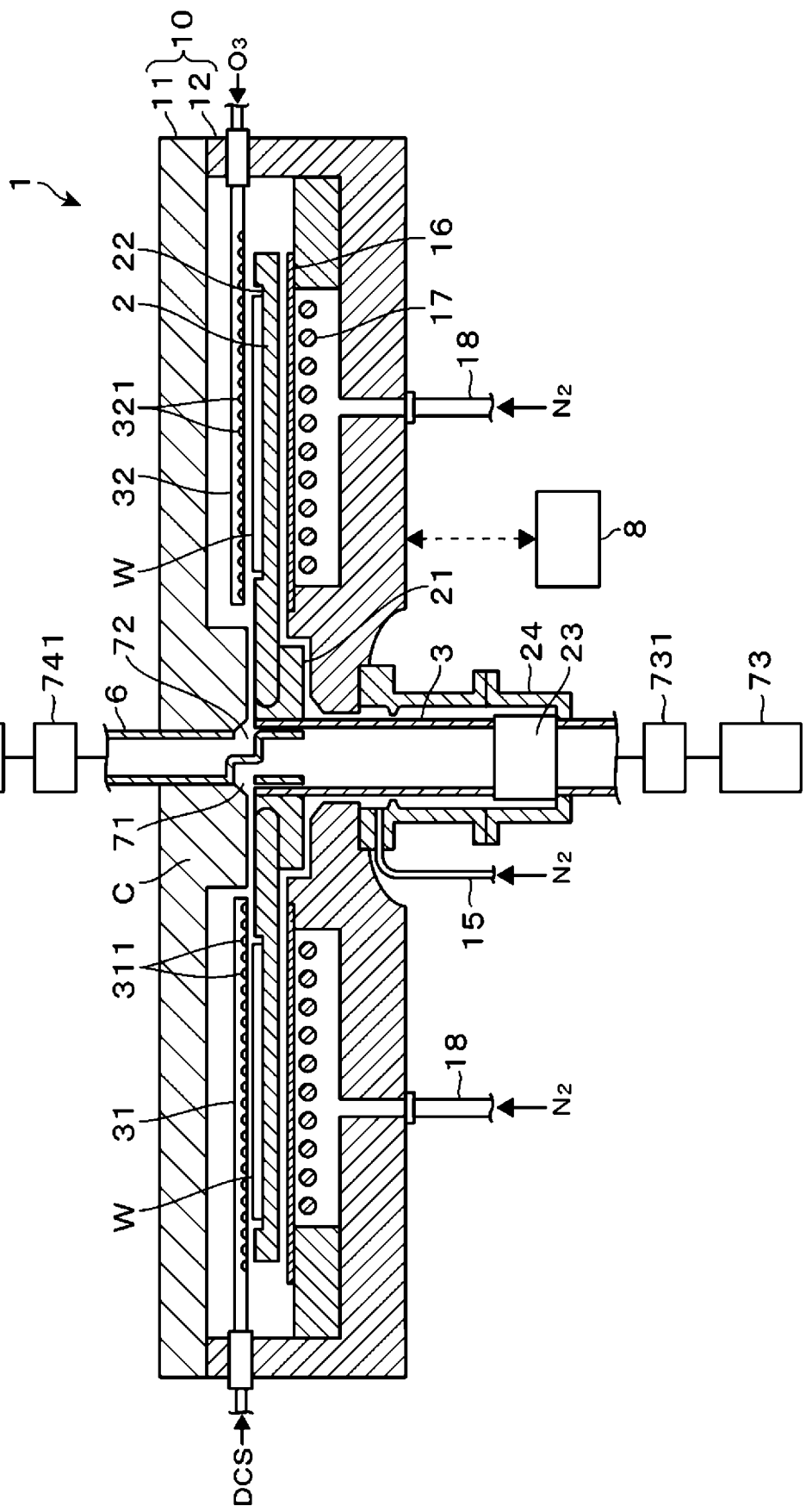
FIG. 1 is a vertical sectional side view showing a film forming apparatus according to a first embodiment of the present disclosure.
Figure 2:
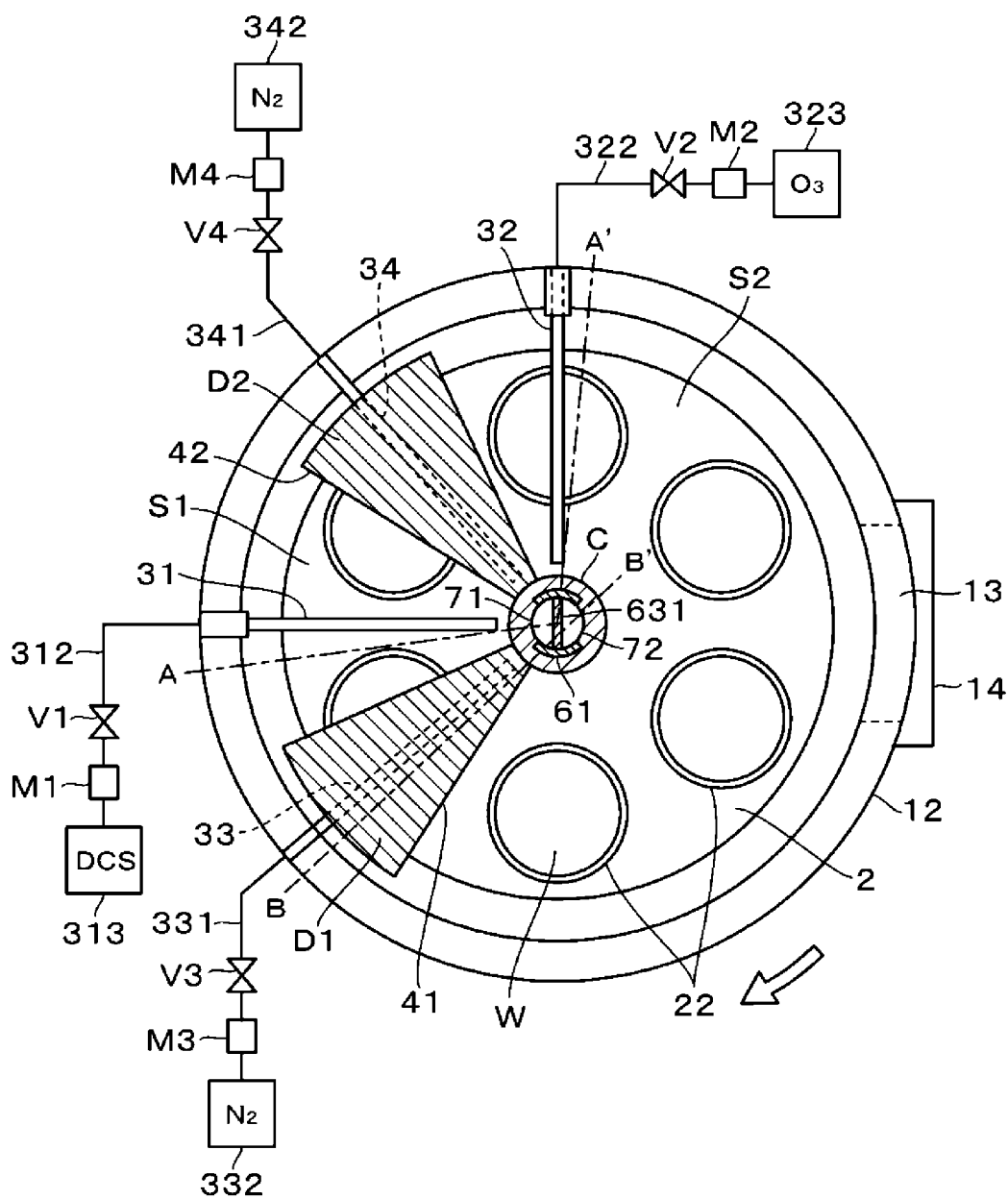
FIG. 2 is a plan view showing the film forming apparatus.
Figure 3:
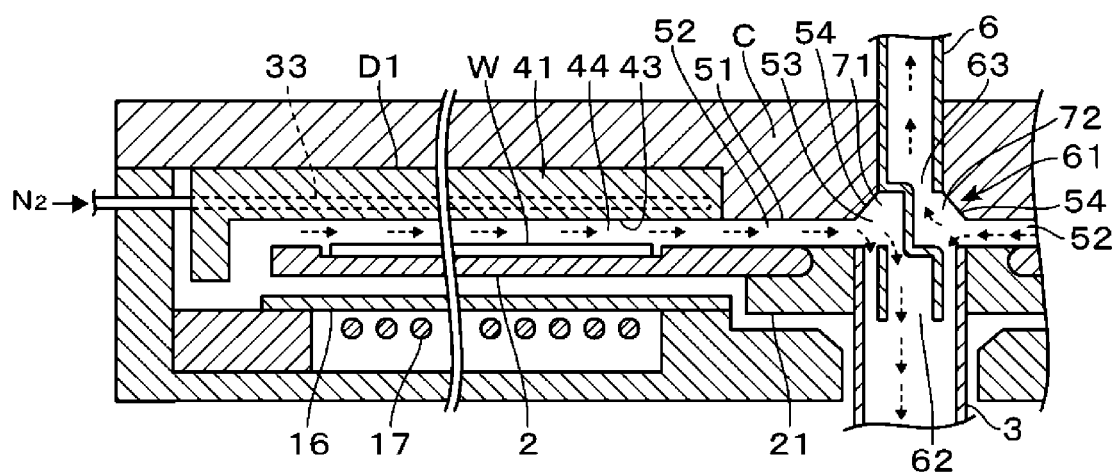
FIG. 3 is a vertical sectional side view showing a part of the film forming apparatus in an enlarged manner.

An apparatus for performing a film forming process on a substrate (hereinafter referred to as a "film forming apparatus") according to a first embodiment of the present disclosure will be described with reference to FIGS. 1 to 4. FIG. 1 is a vertical sectional side view taken along line A-A' in FIG. 2, and FIG. 3 is a vertical sectional side view taken along line B-B' in FIG. 2. As shown in FIGS. 1 and 2, the film forming apparatus 1 includes a vacuum container 10 having a substantially circular plan-view shape. The vacuum container 10 includes a top plate 11 and a container body 12. Inside the vacuum container 10, there is provided, for example, a quart-made rotary table 2 having a rotation center at the center of the vacuum container 10 and configured to revolve wafers W.

As shown in FIG. 2, on the side wall of the vacuum container 10, there is formed a loading/unloading port 13 for delivering a wafer W between an external transfer arm (not shown) and the rotary table 2. The loading/unloading port 13 is airtightly closed by an openable/closable gate valve 14. The wafer W is delivered between the rotary table 2 and the external transfer arm via the loading/unloading port 13. As a result, on the lower side of the rotary table 2 at a position where the wafer W is delivered, there is provided a delivery mechanism (not shown) for lifting the wafer W from the back surface thereof while passing through the rotary table 2.

<Rotary Table>

The rotary table 2 is fixed to a core part 21 at the central portion thereof, and is connected to a revolving drive mechanism 23 via a rotary shaft exhaust passage 3 provided in the core part 21 and extending in the vertical direction. The revolving drive mechanism 23 is composed of, for example, a hollow motor or a hollow shaft motor, and is configured to rotate the rotary table 2 about the rotation center via the rotary shaft exhaust passage 3. The rotary shaft exhaust passage 3 serves as a rotary shaft of the rotary table 2 and an exhaust passage. The exhaust structure including the rotary shaft exhaust passage 3 will be described later. In FIG. 1, reference numeral 24 indicates a case body for accommodating the rotary shaft exhaust passage 3 and the revolving drive mechanism 23. A purge gas supply pipe 15 for supplying an $N_2$ gas as a purge gas to a region below the rotary table 2 is connected to the case body 24.

Recesses 22 for mounting wafers W having a diameter of, for example, 300 mm are formed on one surface side of the rotary table 2. As shown in FIG. 2, the recesses 22 have a circular shape and are provided at a plurality of locations, for example, six locations along the rotation direction (circumferential direction) of the rotary table 2. The recesses 22 of this example are formed at equal intervals in the circumferential direction of the rotary table 2. The diameter and depth of the recesses 22 are set so that, when the wafers W are accommodated in the recesses 22, the surface of the rotary table 2 are flush with the surfaces of the wafers W. Thus, when the rotary table 2 is rotated about the rotation center by the revolving drive mechanism 23 via the rotary shaft exhaust passage 3, the wafers W placed in the recesses 22 are revolved about the rotary shaft exhaust passage 3. In this specification, an example in which the rotary table 2 is rotated clockwise as indicated by an arrow in FIG. 2 will be described, and the rotation direction of the rotary table 2 may be described as a "rotation direction."

<First Processing Region and Second Processing Region>

As shown in FIG. 2, in the vacuum container 10, a first gas nozzle 31 for supplying a first processing gas and a second gas nozzle 32 for supplying a second processing gas are arranged at intervals in the circumferential direction of the vacuum container 10 so as to face the rotary table 2. The first processing gas is a gas adsorbed on the wafer W, and the second processing gas is a gas for reacting with the first processing gas to form a thin film on the surface of the wafer W. In the present embodiment, a dichlorosilane ($SiH_2Cl_2$: DCS) gas, which is a raw material gas, is used as the first processing gas, and an ozone ($O_3$) gas, which is an oxidation gas (reaction gas), is used as the second processing gas. Hereinafter, a case where a silicon oxide film ($SiO_2$ film) is formed by the reaction between the DCS gas and the $O_3$ gas will be described as an example.

The first and second gas nozzles 31 and 32 are arranged so as to extend horizontally along the radial direction of the rotary table 2 from the outer peripheral wall of the vacuum container 10 toward the center thereof, and are provided so as to straddle the regions through which the wafers W pass when the rotary table 2 is rotated. Each of the first and second gas nozzles 31 and 32 is composed of a pipe whose tip is sealed. As shown in FIG. 1, a plurality of gas discharge holes 311 and 321 is formed on the side surface of each of the first and second gas nozzles 31 and 32, respectively.

As shown in FIG. 2, the base end of the first gas nozzle 31 is connected to a DCS gas supply source 313 via a gas supply path 312 provided with a valve V1 and a flow rate adjustment part M1. Further, the base end of the second gas nozzle 32 is connected to an $O_3$ gas supply source 323 via a gas supply path 322 provided with a valve V2 and a flow rate adjustment part M2. The region where the first processing gas is supplied from the first gas nozzle 31 through the discharge holes 311 forms a first processing region S1, and the region where the second processing gas is supplied from the second gas nozzle 32 through the discharge holes 321 forms a second processing region S2. Further, for example, the top plate 11 above the second processing region S2 may be provided with an activation mechanism such as an inductively coupled antenna or a microwave antenna that activates the $O_3$ gas as plasma.

<Separation Region>

As shown in FIGS. 2 and 3, two separation regions D1 and D2 are provided between the first processing region S1 and the second processing region S2 in order to separate the atmospheres in the processing regions S1 and S2. Convex portions 41 and 42 having a substantially fan-like plan-view shape are provided to the top plate 11 of the vacuum container 10 in these separation regions D1 and D2, respectively. Above the wafers W placed on the rotary table 2, the lower surfaces of the convex portions 41 and 42 form main ceiling surfaces 43 for forming separation gas gaps 44 through which a separation gas flows.

In this example, the main ceiling surfaces 43 of the convex portions 41 and 42 are provided close to the rotary table 2 so as to face the upper surface of the rotary table 2, whereby the separation gas gaps 44 are formed between the upper surface of the rotary table 2 and the main ceiling surfaces 43. In FIG. 3, for the sake of convenience of illustration, the separation gas gaps 44 are depicted on a large scale. For example, the regions of the convex portions 41 and 42 near the rotation center of the rotary table 2 are connected to the central region C of the vacuum container 10 described later. Further, the peripheral edges of the convex portions 41 and 42 (the regions of the convex portions 41 and 42 near the outer edge of the rotary table 2) are bent in an L shape so as to face the outer end surface of the rotary table 2 and so as to be slightly spaced apart from the container body 12.

In the separation regions D1 and D2, separation gas nozzles 33 and 34 are provided to form separation gas supply parts for supplying a separation gas. The separation gas nozzles 33 and 34 are made of the same pipes as the first and second gas nozzles 31 and 32, respectively, and are arranged so as to extend horizontally along the radial direction of the rotary table 2 from the outer peripheral wall of the vacuum container 10 toward the center thereof. For example, the separation gas nozzles 33 and 34 are accommodated in the grooves formed on the lower surfaces of the convex portions 41 and 42 so that the main ceiling surfaces 43 are formed on both sides of the separation gas nozzles 33 and 34 in the rotation direction. The base ends of the separation gas nozzles 33 and 34 are connected to supply sources 332 and 342 of the separation gas, for example, an $N_2$ gas, via gas supply paths 331 and 341 provided with valves V3 and V4 and flow rate adjustment parts M3 and M4, respectively.

The separation gas nozzles 33 and 34 are configured to discharge the separation gas toward the rotary table 2 through discharge holes (not shown) formed on the side surface thereof. The $N_2$ gas discharged from the separation gas nozzle 33 spreads from the nozzle 33 to both sides of the vacuum container 10 in the circumferential direction through the separation gas gap 44 below the convex portion 41. Then, the first processing region S1 and the second processing region S2 are separated on the upstream side of the first gas nozzle 31 in the rotation direction.

Further, the $N_2$ gas discharged from the separation gas nozzle 34 spreads from the nozzle 34 to both sides of the vacuum container 10 in the circumferential direction through the separation gas gap 44 below the convex portion 42. Then, the first processing region S1 and the second processing region S2 are separated on the downstream side of the first gas nozzle 31 in the rotation direction. Thus, the atmospheres in the first processing region S1 and the second processing region S2 are separated by the separation regions D1 and D2 provided with the separation gas nozzles 33 and 34 and the convex portions 41 and 42.

<Central Region>

Further, the vicinity of the rotation center of the top plate 11 of the vacuum container 10 is formed as a central region C. In this example, the central region C is formed continuously with the convex portions 41 and 42, for example, in a substantially ring shape in the circumferential direction. As shown in FIG. 3, for example, the ceiling surface 51 in the region closer to the convex portions 41 and 42 in the central region C is formed at the same height as the lower surfaces (main ceiling surfaces) 4 of the convex portions 41 and 42. A gap 52 communicating with the separation gas gap 44 is formed between the ceiling surface 51 and the rotary table 2.

Further, the central region C is provided with a central ceiling surface 54 forming a central gap 53 between the rotary table 2 and the central region C around the rotation center of the rotary table 2. The central gap 53 communicates with the separation gas gap 44 via the gap 52. The central ceiling surface 54 of this example is configured as an inclined surface that inclines inwardly and upwardly toward the rotation center. As can be noted from the flow of the separation gas indicated by a broken line in FIG. 3, in the central region C, the separation gas is supplied from the separation regions D1 and D2 to the central gap 53 via the separation gas gap 44 and the gap 52. Thus, the atmospheres in the first processing region S1 and the second processing region S2 are separated in that region.

<Exhaust Structure>

Figure 4:
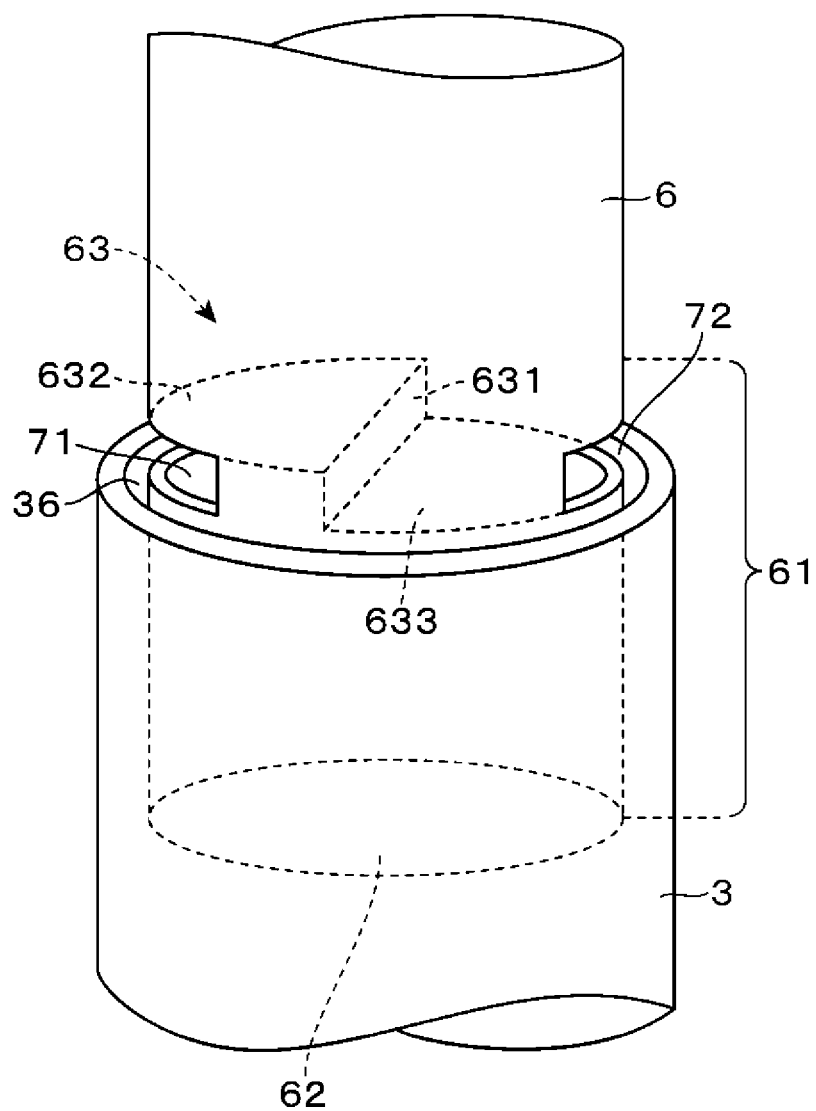
FIG. 4 is a schematic perspective view showing an example of a rotary shaft exhaust passage and a ceiling surface side exhaust passage provided in the film forming apparatus.

Next, the exhaust structure of the film forming apparatus 1 will be described. The film forming apparatus 1 includes a rotary shaft exhaust passage 3 provided on the rotary table 2, and a ceiling surface side exhaust passage 6 formed so as to vertically penetrate the top plate 11 which is a member constituting the central region C. The rotary shaft exhaust passage 3 is formed of a tubular body having an open upper end and extending vertically. Further, as shown in FIG. 4, the ceiling surface side exhaust passage 6 is formed of a tubular body having a lower end opened as a communication port 62 and extending vertically. A protrusion 61 is connected to the lower end side of the ceiling surface side exhaust passage 6. The protrusion 61 is a portion that protrudes downward from the central ceiling surface 54 of the top plate 11. In this example, the protrusion 61 is formed of the same tubular body as the ceiling surface side exhaust passage 6 provided in the top plate 11.

As shown in FIGS. 3 and 4, the lower end of the protrusion 61 is inserted into the opening of the rotary shaft exhaust passage 3 and is configured to communicate with the inside of the rotary shaft exhaust passage 3 via a communication port 62. In this example, the communication port 62 is formed at the lower end of the protrusion 61. However, the communication port 62 may be formed on the side surface of the protrusion 61 while closing the lower end of the protrusion 61. As described above, the rotary shaft exhaust passage 3 is configured to be rotatable by the revolving drive mechanism 23, whereas the ceiling surface side exhaust passage 6 is attached to and fixed to the top plate 11. Thus, the rotary shaft exhaust passage 3 is configured to be rotatable around the protrusion 61 of the ceiling surface side exhaust passage 6. Thus, a slight gap 36 is formed between the inner peripheral surface of the rotary shaft exhaust passage 3 and the outer peripheral surface of the protrusion 61.

As shown in FIG. 4, a first exhaust port 71 and a second exhaust port 72 are formed on the side surface of the tubular body constituting the protrusion 61 at positions on the upper side than the lower end of the protrusion 61. In this example, the first exhaust port 71 is an exhaust port for exhausting the first processing gas discharged from the first processing region 51 to the rotary shaft exhaust passage 3, and the second exhaust port 72 is an exhaust port for exhausting the second processing gas discharged from the second processing region S2 to the ceiling surface side exhaust passage 6.

In this example, as shown in FIG. 2, when viewed in a plan view, the first exhaust port 71 is formed so as to be opened toward the region corresponding to the first processing region S1 surrounded by the separation region D1 and the separation region D2 on the downstream side of the separation region D1 in the rotation direction. On the other hand, when viewed in a plan view, the second exhaust port 72 is formed so as to be opened toward the region corresponding to the second processing region S2 surrounded by the separation region D1 and the separation region D2 on the upstream side of the separation region D1 in the rotation direction. Further, as shown in FIG. 3, each of the first exhaust port 71 and the second exhaust port 72 is formed at a height position where it is opened toward the central gap 53 formed in the central region C.

Further, the protrusion 61 is provided with a partition plate 63 for partitioning the internal space thereof. The partition plate 63 is configured to guide the first processing gas exhausted from the first exhaust port 71 to the rotary shaft exhaust passage 3, and guide the second processing gas exhausted from the second exhaust port 72 to the ceiling surface side exhaust passage 6. For example, as shown in FIGS. 3 and 4, the partition plate 63 is formed so as to vertically partition the inside of the protrusion 61, the first exhaust port 71 is configured to form a side surface of the protrusion 61 below the partition plate 63, and the second exhaust port 72 is formed on the side surface of the protrusion 61 above the partition plate 63.

As shown in FIGS. 3 and 4, the partition plate 63 of this example is formed so as to bend in a stepped manner. For example, when viewed in a plan view, the partition plate 63 includes a wall portion 631 extending in the vertical direction at a position for partitioning a region where the first exhaust port 71 and the second exhaust port 72 are formed. Further, the upper end of the wall portion 631 and the inner peripheral surface of the ceiling surface side exhaust passage 6 are connected by a plate-shaped body 632, and the lower end of the wall portion 631 and the inner peripheral surface of the ceiling surface side exhaust passage 6 are connected by a plate-shaped body 633, so that the internal space of the protrusion 61 is partitioned.

As shown in FIGS. 1 and 2, the lower end of the rotary shaft exhaust passage 3 is connected to a first vacuum exhaust mechanism 73 via a pressure regulation part 731, and the upper end of the ceiling surface side exhaust passage 6 is connected to a second vacuum exhaust mechanism 74 via a pressure regulation part 741. The vacuum exhaust mechanism is configured by, for example, a vacuum pump, and the pressure regulation part is configured by, for example, a butterfly valve. As a result, when the first vacuum exhaust mechanism 73 is operated, the atmosphere in the rotary shaft exhaust passage 3 is exhausted downward, and when the second vacuum exhaust mechanism 74 is operated, the atmosphere in the ceiling surface side exhaust passage 6 is exhausted upward.

Returning to FIG. 1, the description of the film forming apparatus 1 will be continued. In the space between the rotary table 2 and the bottom surface of the vacuum container 10, a heater 17 is provided over the entire circumference via a quartz-made cover member 16. The wafer W is heated by the heat radiated from the heater 17 and the heat transferred from the rotary table 2 heated by the heater 17. Further, on the lower side of the heater 17, purge gas supply pipes 18 penetrating the bottom surface portion of the vacuum container 10 are provided at a plurality of locations in the circumferential direction to supply an $N_2$ gas, which is a purge gas.

Further, the film forming apparatus 1 includes a controller 8 composed of a computer for controlling the operation of the entire apparatus. A program for performing a film forming process described later is stored in a memory of the controller 8. This program is composed of steps to execute the operation of the apparatus, including the exhaust of the processing gas through the rotary shaft exhaust passage 3 and the ceiling surface side exhaust passage 6 described later, and is installed by a non-transitory computer-readable storage medium such as a hard disk, a compact disk, a magneto-optical disk, a memory card, a flexible disk, or the like.

<Operation of Film Forming Apparatus>

Next, the operation of the above-described film forming apparatus 1 including a method of exhausting the processing gas from the film forming apparatus will be described. First, the gate valve 14 is opened, and the wafer W delivered between the outside and the rotary table 2 is loaded and unloaded via the loading/unloading port 13. For example, a wafer replacement operation is executed in which the processed wafers W arranged in the respective recesses 22 of the rotary table 2 are unloaded and then the wafers W to be processed next are loaded. In this replacement operation, the wafers W are loaded and unloaded by using an external transfer mechanism (not shown) and the delivery mechanism (not shown) described above. In this way, while the rotary table 2 is intermittently rotated, the six recesses 22 are sequentially moved to the loading/unloading positions, and the wafers W are loaded and unloaded for the respective recesses 22.

After the wafers W to be processed next are placed on all the recesses 22, the gate valve 14 is closed, the inside of the vacuum container 10 is vacuumed by the first and second vacuum exhaust mechanisms 73 and 74 and the pressure regulation parts 731 and 741, and the wafers W are heated to, for example, 400 degrees C. by the heater 17 while rotating the rotary table 2. Subsequently, while rotating the rotary table 2, a DCS gas, which is the first processing gas, is supplied from the first gas nozzle 31. Further, an $O_3$ gas, which is the second processing gas, is supplied from the second gas nozzle 32 to execute a film forming process.

The inside of the vacuum container 10 is exhausted through the rotary shaft exhaust passage 3 by the first vacuum exhaust mechanism 73, and is exhausted through the ceiling surface side exhaust passage 6 by the second vacuum exhaust mechanism 74. Therefore, in the first processing region 51, the first processing gas (DCS gas) supplied from the first gas nozzle 31 spreads over the first processing region 51 and flows toward the first exhaust port 71 provided in the vicinity of the rotation center of the rotary table 2.

Figure 5:
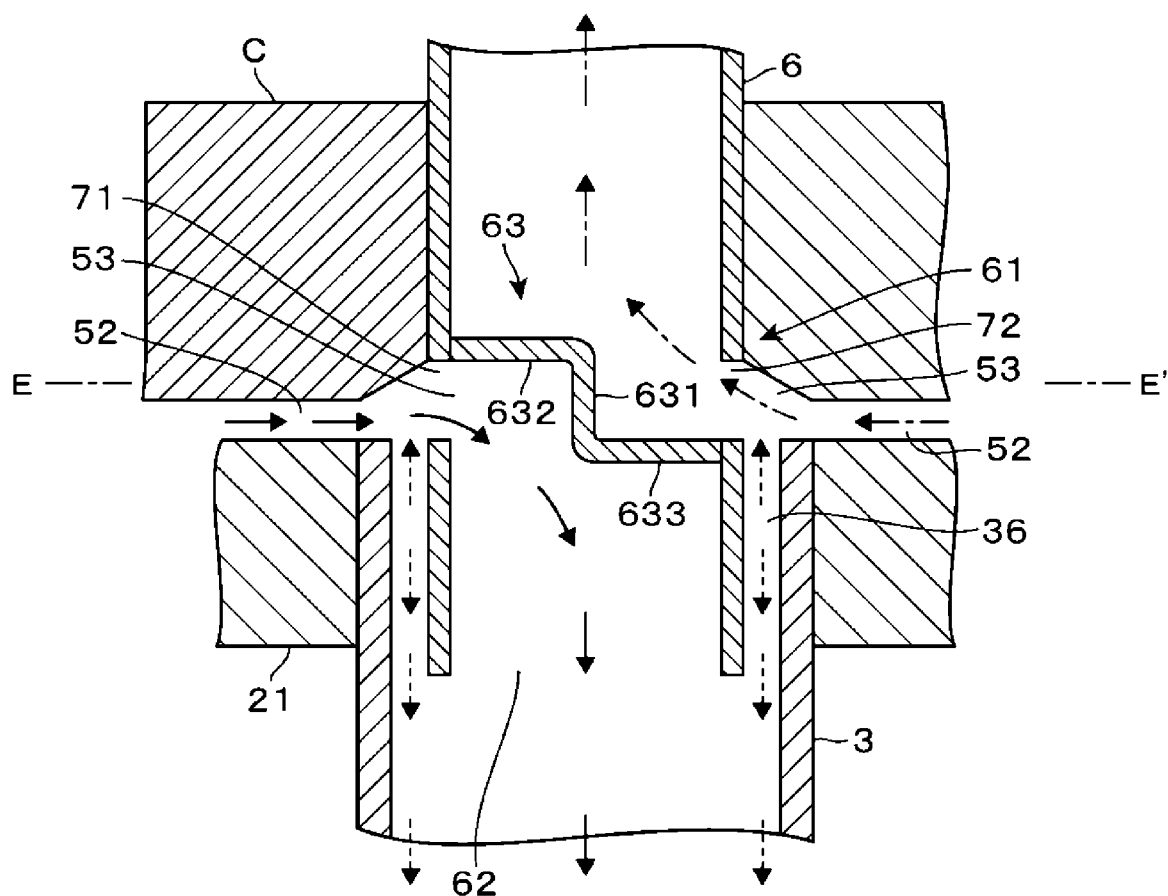
FIG. 5 is a vertical sectional side view showing an operation of the rotary shaft exhaust passage and the ceiling surface side exhaust passage.
Figure 6:
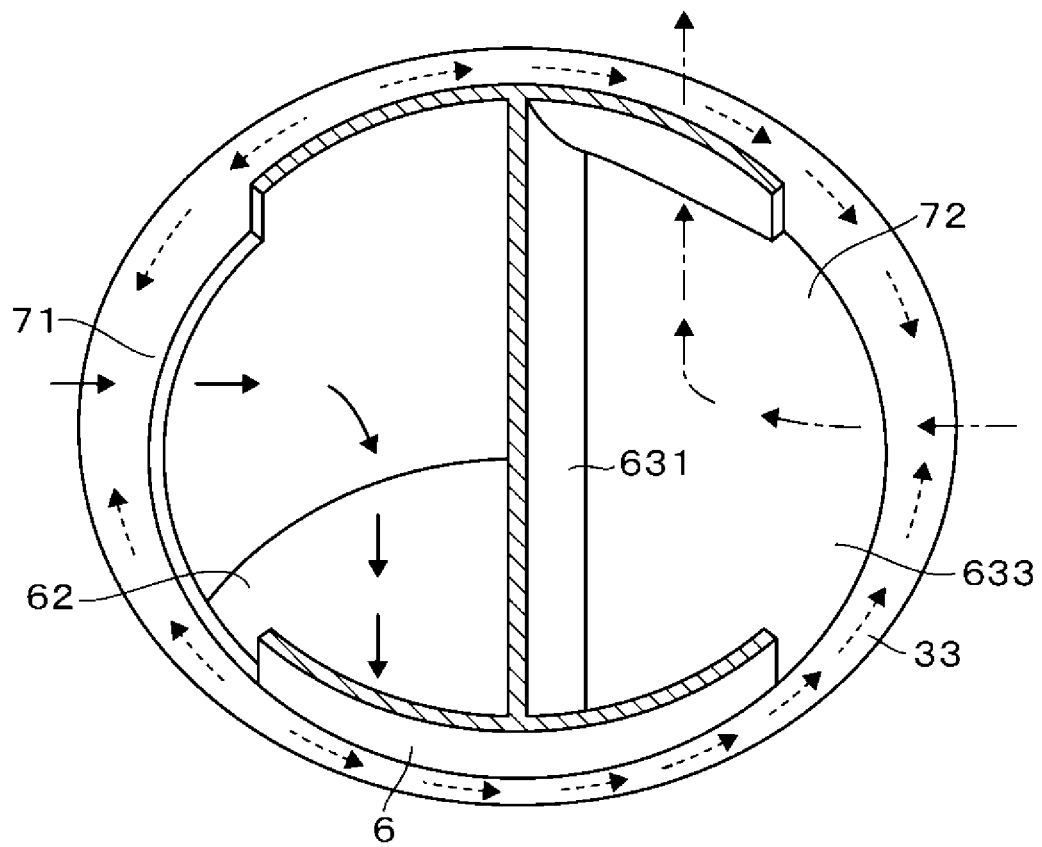
FIG. 6 is a schematic enlarged perspective view showing the operation of the rotary shaft exhaust passage and the ceiling surface side exhaust passage.

In FIGS. 5 and 6, the flow of the DCS gas, which is the first processing gas, is indicated by a solid line. FIG. 6 is a schematic enlarged perspective view taken along line E-E' in FIG. 5. Thus, the DCS gas flows into the first exhaust port 71 through the gap 52 and the central gap 53 in the central region C. In this way, the DCS gas flowing into the central gap 53 from the first processing region 51 is discharged to the first exhaust port 71. The DCS gas is guided downward in the space formed by the plate-shaped body 632 of the partition plate 63 and the wall portion 631 so as to flow toward the rotary shaft exhaust passage 3, and is exhausted through the rotary shaft exhaust passage 3.

On the other hand, in the second processing region S2, the second processing gas ($O_3$ gas) supplied from the second gas nozzle 32 spreads over the second processing region S2 and flows toward the second exhaust port 72 provided in the vicinity of the rotation center of the rotary table 2. Then, as indicated by a one-dot chain line in FIGS. 5 and 6 showing the flow of the $O_3$ gas which is the second processing gas, the $O_3$ gas passes through the gap 52 and the central gap 53 in the central region C and flows into the second exhaust port 72. Thus, the $O_3$ gas flowing into the central gap 53 from the second processing region S2 is discharged to the second exhaust port 72. The $O_3$ gas is guided upward in the space formed by the plate-shaped body 633 of the partition plate 63 and the wall portion 631 so as to flow toward the ceiling surface side exhaust passage 6, and is exhausted through the ceiling surface side exhaust passage 6.

Further, in the separation regions D1 and D2, the separation gas ($N_2$ gas) supplied from the separation gas nozzles 33 and 34 spreads in the separation gas gap 44 and flows toward the first exhaust port 71 and the second exhaust port 72. As indicated by a broken line in FIGS. 5 and 6 showing the flow of the $N_2$ gas which is the separation gas, the $N_2$ gas flows from the separation gas gap 44 into the central gap 53 through the gap 52. Then, as shown in FIG. 6, a part of the $N_2$ gas enters the gap 36 between the rotary shaft exhaust passage 3 and the ceiling surface side exhaust passage 6 in the central gap 53. Further, the remaining $N_2$ gas flows toward the first exhaust port 71 and the second exhaust port 72. Thus, the $N_2$ gas discharged to the first exhaust port 71 flows toward the rotary shaft exhaust passage 3 like the DCS gas, and the $N_2$ gas discharged to the second exhaust port 72 flows toward the ceiling surface side exhaust passage 6 like the $O_3$ gas.

As described above, the separation regions D1 and D2 are provided between the first processing region S1 and the second processing region S2 so as to separate the atmospheres in the processing regions S1 and S2. Therefore, even if the DCS gas tries to flow toward the second exhaust port 72 through the central gap 53, such a flow is obstructed by the flow of the $N_2$ gas, and the entry of the DCS gas into the second exhaust port 72 is suppressed. On the other hand, even if the $O_3$ gas tries to flow toward the first exhaust port 71 through the central gap 53, such a flow is obstructed by the flow of the $N_2$ gas, and the entry of the $O_3$ gas into the first exhaust port 71 is suppressed.

Returning to the description of the film forming process for the wafer W, the wafer W passes through the first processing region S1 where the DCS gas, which is the first processing gas, is adsorbed on the wafer W while spreading radially on the rotary table 2. Then, the wafer W on which the DCS gas is adsorbed passes through the second processing region S2 due to the rotation of the rotary table 2. By supplying an $O_3$ gas, which is the second processing gas, to the second processing region S2, the DCS gas adsorbed on the wafer W is oxidized by the $O_3$ gas, so that a thin silicon oxide film ($SiO_2$ film) is formed on the surface of the wafer W. At this time, the $O_3$ gas may be activated by using the above-described activation mechanism, if necessary.

By continuing the rotation of the rotary table 2 in this way, the six revolving wafers W are alternately and repeatedly passed through the first processing region S1 and the second processing region S2. Then, the adsorption of the DCS gas on the surface of the wafer W and the oxidation of the components of the adsorbed DCS gas are performed many times in the named order, whereby a reaction product is stacked to form a $SiO_2$ film having a set film thickness.

After the $SiO_2$ film having a set film thickness is formed and the film forming process is completed, the wafer W is loaded and unloaded through the loading/unloading port 13. When the wafer W is unloaded, the recess 22 to be subjected to delivery is sequentially moved to the loading/unloading position facing the loading/unloading port 13 by the rotation of the rotary table 2. Then, as described above, the wafer W is delivered between the external transfer arm and the delivery mechanism, and is unloaded from the loading/unloading port 13. The wafer W to be processed next is loaded.

Although the present disclosure is directed to the study for the exhaust structure of the vacuum container 10, here, the problems of the conventional exhaust structure will be briefly described. In an apparatus in which a wafer W is revolved by the rotation of a rotary table and a film is formed by an ALD method using a first processing gas and a second processing gas, an exhaust port is formed outside of a wafer arrangement region for the purpose of reducing particles. As the layout of the exhaust port, a configuration in which the exhaust port is arranged outside the rotary table or a configuration in which the exhaust port is arranged at the center of the rotary table is used.

However, in the configuration in which the exhaust port is arranged outside the rotary table, there is a risk that an unreacted processing gas flows toward the back surface of the rotary table, and there is a concern that components generated by thermal decomposition are adsorbed on the inner wall of the rotary table or the vacuum container. On the other hand, in the configuration in which the exhaust port is arranged at the center of the rotary table, the installation space of an exhaust passage is limited at the center of the rotary table. Therefore, the separation performance for the first processing gas and the second processing gas may be deteriorated. Further, as the exhaust passages for the two types of processing gases are provided at the center of the rotary table, the cross-sectional area of each of the exhaust passages becomes smaller. As a result, there is a concern that the pressure loss increases and the exhaust speed decreases.

On the other hand, in the above-described embodiment, when the first processing gas and the second processing gas are exhausted from the vicinity of the rotation center of the rotary table 2 through different exhaust passages, it is possible to suppress the gas separation performance and the decrease in the exhaust speed. In the above-described embodiment, by providing the rotary shaft exhaust passage 3 at the rotation center of the rotary table 2, and providing the ceiling surface side exhaust passage 6 in the central region C of the top plate 11 of the vacuum container 10, the atmosphere in the vacuum container 10 is exhausted from the vicinity of the rotation center. The first exhaust port 71 and the second exhaust port 72 are provided in the vicinity of the rotation center. The first processing gas is exhausted to the rotary shaft exhaust passage 3 through the first exhaust port 71, and the second processing gas is exhausted to the ceiling surface side exhaust passage 6 through the second exhaust port 72.

As described above, since the configuration of the present disclosure is such that the exhaust ports 71 and 72 are arranged near the center of the rotary table 2, it is possible to solve the problem when the exhaust ports are installed outside the rotary table 2. Further, the dedicated exhaust ports 71 and 72, the rotary shaft exhaust passage 3, and the ceiling surface side exhaust passage 6 are provided for each of the first processing gas and the second processing gas. The rotary shaft exhaust passage 3 and the ceiling surface side exhaust passage 6 are arranged one above the other in the vertical direction. Therefore, it is possible to solve the problem when the exhaust port is installed at the center of the rotary table 2.

That is, since the two exhaust passages are arranged one above the other in the vertical direction, a sufficient seal length can be secured as compared with the case where the two exhaust passages are arranged side by side. Therefore, it is possible to suppress the deterioration of the gas separation performance, and it is possible to exhaust the first processing gas and the second processing gas while ensuring high separation performance. Further, by arranging the rotary shaft exhaust passage 3 and the ceiling surface side exhaust passage 6 one above the other, these exhaust passages 3 and 6 overlap with each other in a plan view. For this reason, it is possible to reduce the installation area of the exhaust passages. Therefore, as compared with the case where two exhaust passages are arranged side by side in the left-right direction, it is possible to design the exhaust passages to have a large flow path cross-sectional area, and it is possible to secure a large exhaust speed.

Further, in the above-described embodiment, the rotation shaft of the rotary table 2 is used as an exhaust passage and is configured to rotate around the ceiling surface side exhaust passage 6 fixed to the top plate 11 of the vacuum container 10. Therefore, it is possible to suppress the increase in size and complexity of the apparatus as compared with the case where the exhaust passage is provided separately from the rotary shaft of the rotary table 2.

Further, in the above-described embodiment, the protrusion 61 is connected to the ceiling surface side exhaust passage 6. By the partition plate 63 in the protrusion 61, the first processing gas is guided to the rotary shaft exhaust passage 3, and the second processing gas is guided to the ceiling surface side exhaust passage 6. Therefore, due to the action of the partition plate 63 in the protrusion 61, the first processing gas and the second processing gas flow rapidly through the rotary shaft exhaust passage 3 and the ceiling surface side exhaust passage 6, respectively. Accordingly, it is possible to prevent the first processing gas and the second processing gas from staying in the protrusion 61 or the central gap 53 and from being partially mixed with each other.

Further, by allowing the separation gas to flow from the separation gas gap 44 into the central gap 53 in which the first exhaust port 71 and the second exhaust port 72 are opened, it is possible to suppress the entry of the second processing gas into the first exhaust port 71 and the entry of the first processing gas into the second exhaust port 72. Therefore, the first processing gas and the second processing gas can be exhausted through the rotary shaft exhaust passage 3 and the ceiling surface side exhaust passage 6 in a state of being separated from each other, and the first processing gas and the second processing gas can be prevented from being partially mixed in these exhaust passages 3 and 6. As a result, it is possible to prevent the reaction product of both processing gases from adhering to the exhaust passages 3 and 6.

Second Embodiment of Film Forming Apparatus

Figure 7:
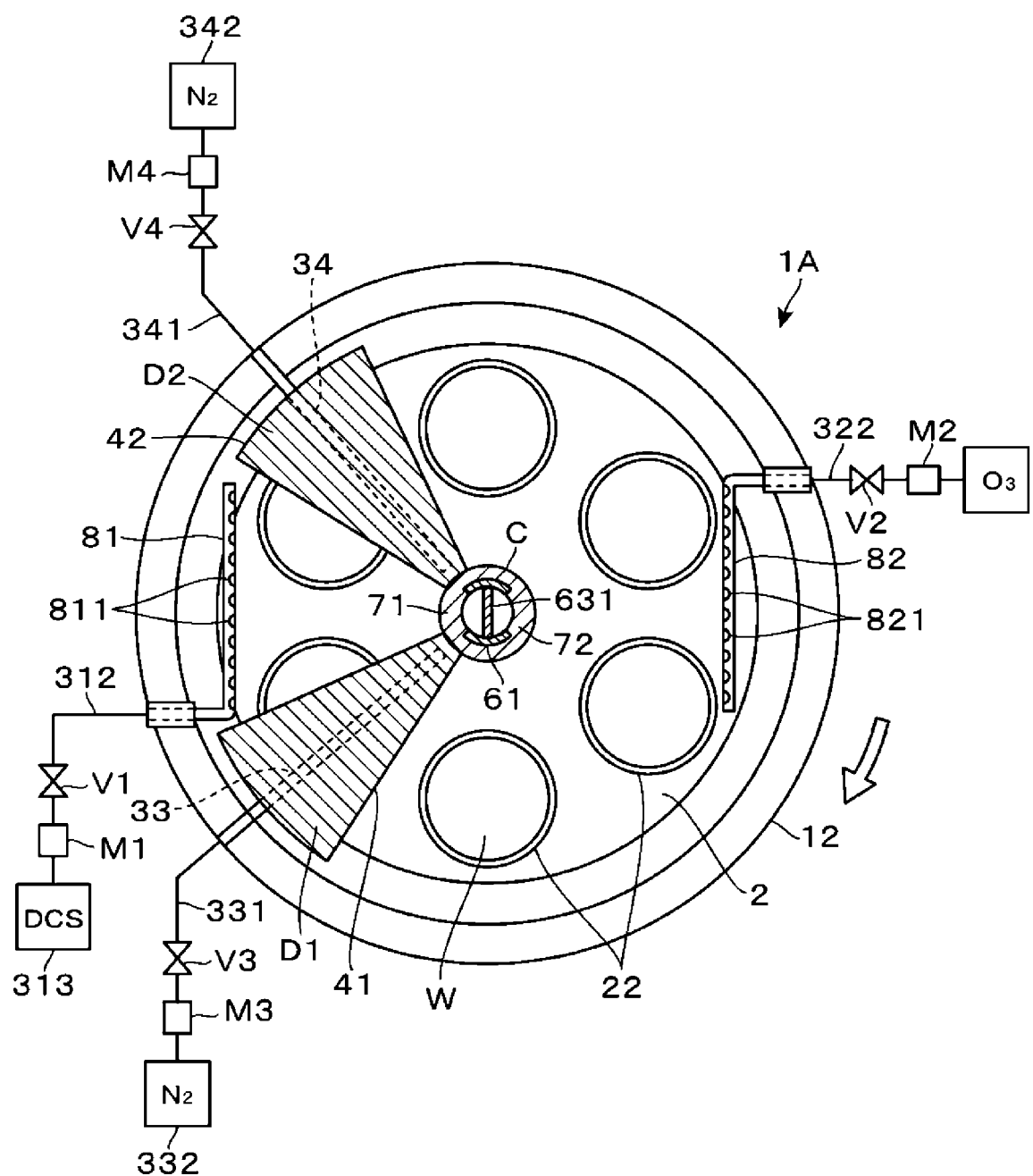
FIG. 7 is a vertical sectional side view showing a film forming apparatus according to a second embodiment of the present disclosure.

As described above, the configuration of the present disclosure is also applicable to a film forming apparatus shown in FIG. 7. FIG. 7 is a plan view showing a film forming apparatus 1A according to a second embodiment. The difference between the film forming apparatus 1A and the film forming apparatus 1 shown in FIG. 2 and the like is the arrangement direction of the first gas nozzle 81 and the second gas nozzle 82. In this example, each of the first and second gas nozzles 81 and 82 configured by pipes is arranged so as to extend horizontally along the direction of a chord of a fan shape including the rotation center of the rotary table 2. For example, the first gas nozzle 81 is arranged to extend horizontally along the direction of a chord of a fan shape between the downstream sides of the separation regions D1 and D2 in the rotation direction of the rotary table. Further, the second gas nozzle 82 is arranged to extend horizontally along the direction of a chord of a fan shape between the upstream sides of the separation regions D1 and D2 in the rotation direction of the rotary table so that, for example, the second gas nozzle 82 faces the first gas nozzle 81 across the rotation center.

Each of the first and second gas nozzles 81 and 82 has a plurality of gas discharge holes 811 and 812 formed on the side surface of a pipe. For example, the gas discharge holes 811 and 812 are provided so as to discharge the first processing gas and the second processing gas toward the first exhaust port 71 and the second exhaust port 72, respectively. Except for the arrangement of the first gas nozzle 81 and the second gas nozzle 82, the film forming apparatus 1A has the same configuration as the film forming apparatus 1 according to the first embodiment in terms of the separation regions D1 and D2 and the components such as the rotary shaft exhaust passage 3 and the ceiling surface side exhaust passage 6. The same components of the film forming apparatus 1A as the components of the film forming apparatus 1 are designated by the same reference numerals, and the description thereof will be omitted.

In the film forming apparatus 1A, the first processing gas discharged from the first gas nozzle 81 flows toward the first exhaust port 71 while spreading over the first processing region S1. The first processing gas is exhausted from the rotary shaft exhaust passage 3 through the exhaust port 71. Further, the second processing gas discharged from the second gas nozzle 82 flows toward the second exhaust port 72 while spreading over the second processing region S2. The second processing gas is exhausted from the ceiling surface side exhaust passage 6 through the second exhaust port 72.

As in the first embodiment, the entry of the first processing gas into the second processing region S2 or the second exhaust port 72 is suppressed by the flow of the separation gas, and the entry of the second processing gas into the first processing region S1 or the first exhaust port 71 is suppressed by the flow of the separation gas. Since the exhaust structure including the rotary shaft exhaust passage 3 and the ceiling surface side exhaust passage 6 is the same as that of the first embodiment, it is possible to obtain the same effects as those of the first embodiment.

Third Embodiment of Film Forming Apparatus

Figure 8:
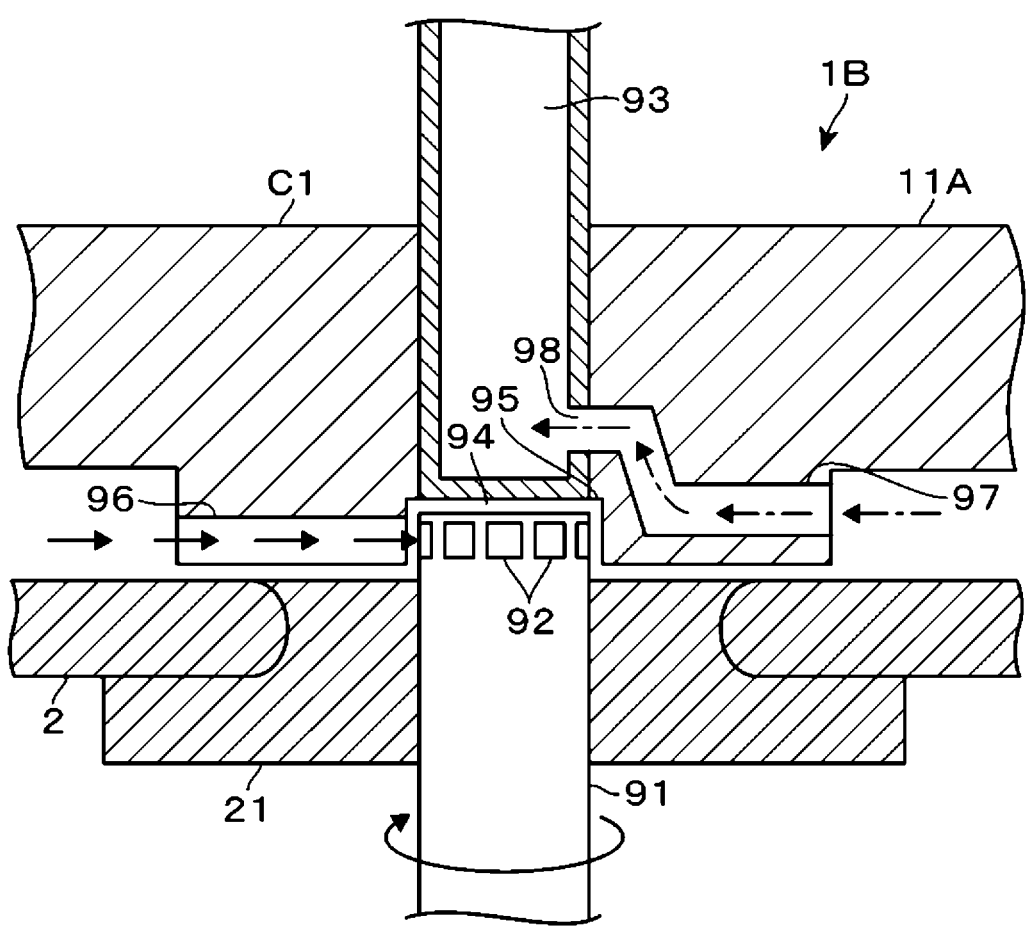
FIG. 8 is a vertical sectional side view showing a part of a film forming apparatus according to a third embodiment of the present disclosure.

The film forming apparatus of the present disclosure may be configured as shown in FIG. 8. FIG. 8 is a vertical sectional side view showing a part of a film forming apparatus 1B according to a third embodiment. A rotary shaft exhaust passage 91 is formed of a tubular body having a closed upper end. The upper end portion of the rotary shaft exhaust passage 91 is provided so as to protrude upward from the upper surface of the core part 21. A plurality of first exhaust ports 92 is formed on the side surface of the upper end portion of the rotary shaft exhaust passage 91 at intervals from each other along the circumferential direction. Further, a ceiling surface side exhaust passage 93 of this example is formed of a tubular body having a closed lower end, and is arranged vertically with respect to the rotary shaft exhaust passage 91 with the center thereof aligned with the center of the rotary shaft exhaust passage 91. The lower end of the ceiling surface side exhaust passage 93 is arranged above the upper end of the rotary shaft exhaust passage 91. A central gap 94 is formed between the rotary shaft exhaust passage 91 and the ceiling surface side exhaust passage 93. Therefore, the lower end of the ceiling surface side exhaust passage 93 forms a part of the central ceiling surface 95.

In the central region C1 of the top plate 11A, a first communication path 96 for guiding the first processing gas passed through the processing region S1 toward the rotary shaft exhaust passage 91 is formed at a position corresponding to the first processing region S1. The first communication path 96 is formed, for example, at an aligned height position so as to communicate with the first exhaust port 92 of the rotary shaft exhaust passage 91. The first processing gas flows through the first communication path 96 and is exhausted to the rotary shaft exhaust passage 91 through the first exhaust port 92.

Further, in the central region C1, a second communication path 97 for guiding the second processing gas passed through the second processing region S2 toward the ceiling surface side exhaust passage 93 is formed at a position corresponding to the second processing region S2. Further, the ceiling surface side exhaust passage 93 is formed with a second exhaust port 98 communicating with the second communication path 97. The second processing gas flows through the second exhaust port 98 via the second communication path 97 and is exhausted to the ceiling surface side exhaust passage 93.

The rotary table 2 and the separation regions D1 and D2 are configured in the same manner as in the first embodiment, and the first gas nozzle and the second gas nozzle may have the same configuration as that of the first embodiment or that of the second embodiment. Other components of the film forming apparatus 1B are configured in the same manner as in the first embodiment. Also in this embodiment, the rotary shaft exhaust passage 91 for exhausting the first processing gas and the ceiling surface side exhaust passage 93 for exhausting the second processing gas are arranged one above the other. Therefore, it is possible to secure high gas separation performance and a high exhaust speed.

In the first to third embodiments described above, the first processing gas is exhausted by the rotary shaft exhaust passage, and the second processing gas is exhausted by the ceiling surface side exhaust passage. However, the present disclosure is not limited to this example. It may be possible to adopt a configuration in which the first processing gas is exhausted by the ceiling surface side exhaust passage through the first exhaust port, and the second processing gas is exhausted by the rotary shaft exhaust passage through the second exhaust port.

In the film forming apparatus of the present disclosure, the first processing gas is not limited to the DCS gas. For example, a silicon-containing gas such as a bis(tertiary-butylamino)silane (BTBAS) gas or the like may be used as the first processing gas. Further, the second processing gas is not limited to the O$_3$ gas. Other oxidation gases may be used as the second processing gas. Moreover, the present disclosure may be applied to a film forming apparatus that forms a silicon nitride (SiN) film on a wafer W by using a silicon-containing gas such as a DCS gas or the like as the first processing gas and using a nitriding gas such as an ammonia (NH$_3$) gas or the like as the second processing gas. In addition, the exhaust structure using the rotary shaft exhaust passage and the ceiling surface side exhaust passage according to the present disclosure may be applied to a film forming apparatus that forms various films by the reaction of a first processing gas and a second processing gas, which are not limited to the above-mentioned example.

In the above-described embodiments, the supply of the first processing gas to the first processing region and the supply of the second processing gas to the second processing region are not limited to the example in which the gas nozzles formed of pipes are used. For example, in the regions of the top plate 11 of the vacuum container 10 corresponding to the first processing region S1 and the second processing region S2, gas supply parts having a plurality of gas discharge holes on the lower surface thereof may be provided to supply the first processing gas and the second processing gas in a shower shape.

Further, the separation regions are not limited to the above-described configuration. A configuration may work, as long as it includes a separation gas supply part for supplying a separation gas and a main ceiling surface located on both sides of the separation gas supply part in the rotation direction and configured to form a separation gas gap between the rotary table and the main ceiling surface. Therefore, the present disclosure is not limited to the configuration in which the separation regions are formed by the convex portions 41 and 42. For example, a separation gas supply chamber having a discharge port for supplying the separation gas may be provided on the lower surface of the top plate, and the lower surface of the separation gas supply chamber may be used as a main ceiling surface.

Further, in the third embodiment, another example of the rotary shaft exhaust passage, the ceiling surface side exhaust passage, and the central region provided with the central ceiling surface has been described. However, the present disclosure is not limited to the configuration of the above-described third embodiment. Further, in the first and second embodiments, the protrusion provided in the ceiling surface side exhaust passage may be a part of a tubular body constituting the ceiling surface side exhaust passage, or may be formed by making another tubular body and connecting the tubular body to the ceiling surface side exhaust passage. Further, the shapes of the protrusion and the partition plate are not limited to the above-described ones as long as the partition plate can guide the first processing gas to one of the rotary shaft exhaust passage and the ceiling surface side exhaust passage and can guide the second processing gas to the other one of the rotary shaft exhaust passage and the ceiling surface side exhaust passage.

Further, the other unintended processing gas may enter the rotary shaft exhaust passage or the ceiling side exhaust passage depending on the types of the first processing gas and the second processing gas, the conditions of the film forming process such as the setting of the exhaust speed and the deposition rate, the arrangement position and size of the first and second processing regions, and the arrangement of the first and second exhaust ports. Thus, when film formation problems occur due to the inflow of a partially mixed gas, the components of the rotary shaft exhaust passage and the ceiling surface side exhaust passage may be heated to suppress adhesion of a reaction product to the inside of these exhaust passages.

It should be considered that the embodiments disclosed herein are exemplary and not limitative in all respects. The above-described embodiments may be omitted, replaced, or modified in various forms without departing from the scope of the appended claims and their gist.

According to the present disclosure in some embodiments, it is possible to suppress a decrease in gas separation performance and a decrease in exhaust speed when a first processing gas and a second processing gas are exhausted from the vicinity of a rotation center of a rotary table through different exhaust passages.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An apparatus for performing a film forming process on a substrate, comprising:
   a rotary table provided in a vacuum container, configured to support a plurality of substrates on one surface side of the rotary table, and configured to rotate about a rotation center to revolve the substrates around the rotation center;
   a separation region configured to separate an atmosphere in a first processing region to which a first processing gas to be adsorbed on the substrate is supplied and an atmosphere in a second processing region to which a second processing gas for reacting with the first processing gas to form a thin film on a surface of the substrate is supplied, and provided to be located between the first processing region and the second processing region in a rotation direction, the separation region including a separation gas supply configured to supply a separation gas and a main ceiling surface located on both sides of the separation gas supply in the rotation direction and configured to form a separation gas gap for the separation gas to flow between the rotary table and the main ceiling surface;

a central region including a central ceiling surface arranged around the rotation center to form a central gap communicating with the separation gas gap between the rotary table and the central ceiling surface to separate the atmosphere in the first processing region and the atmosphere in the second processing region;

a rotary shaft exhaust passage made of a tubular body and connected to the rotary table to rotate the rotary table about the rotation center, the rotary shaft exhaust passage having an exhaust path formed therein;

a ceiling surface side exhaust passage formed so as to vertically penetrate a member constituting the central region;

a first exhaust port configured to exhaust the first processing gas discharged from the first processing region to one of the rotary shaft exhaust passage and the ceiling surface side exhaust passage; and a second exhaust port configured to exhaust the second processing gas discharged from the second processing region to the other one of the rotary shaft exhaust passage and the ceiling surface side exhaust passage.

2. The apparatus of claim 1, wherein an opening is formed at an upper end of the rotary shaft exhaust passage, wherein a protrusion made of a tubular body is connected to the ceiling surface side exhaust passage, the protrusion protruding downward from the central ceiling surface, the protrusion having a lower end portion inserted into the opening of the rotary shaft exhaust passage, the protrusion having a communication port formed to communicate with an inside of the rotary shaft exhaust passage, and wherein the first exhaust port and the second exhaust port are formed on a side surface of the protrusion at positions on an upper side than the lower end portion inserted into the opening, the protrusion provided with a partition plate for partitioning an internal space of the protrusion so as to guide the first processing gas exhausted from the first exhaust port toward the one of the rotary shaft exhaust passage and the ceiling surface side exhaust passage and guide the second processing gas exhausted from the second exhaust port toward the other one of the rotary shaft exhaust passage and the ceiling surface side exhaust passage.

3. The apparatus of claim 2, wherein the first processing gas flowing into the central gap from the first processing region is discharged to the first exhaust port, and the second processing gas flowing into the central gap from the second processing region is discharged to the second exhaust port.

4. The apparatus of claim 3, wherein the separation gas is allowed to flow from the separation gas gap into the central gap to suppress entry of the second processing gas into the first exhaust port and entry of the first processing gas into the second exhaust port.

5. The apparatus of claim 4, further comprising:
a first gas nozzle configured to supply the first processing gas into the first processing region; and
a second gas nozzle configured to supply the second processing gas into the second processing region,
wherein each of the first gas nozzle and the second gas nozzle is arranged so as to extend horizontally along a radial direction of the rotary table, and is composed of a pipe having a plurality of gas discharge holes formed on a side surface of the pipe.

6. The apparatus of claim 1, further comprising:
a first gas nozzle configured to supply the first processing gas into the first processing region; and
a second gas nozzle configured to supply the second processing gas into the second processing region,
wherein each of the first gas nozzle and the second gas nozzle is arranged so as to extend horizontally along a radial direction of the rotary table, and is composed of a pipe having a plurality of gas discharge holes formed on a side surface of the pipe.

7. The apparatus of claim 1, further comprising:
a first gas nozzle configured to supply the first processing gas into the first processing region; and
a second gas nozzle configured to supply the second processing gas into the second processing region,
wherein each of the first gas nozzle and the second gas nozzle is arranged so as to extend horizontally along a direction of a chord of a fan shape including the rotation center of the rotary table, and is composed of a pipe having a plurality of gas discharge holes formed on a side surface of the pipe.

8. A method of exhausting a processing gas from an apparatus for performing a film forming process on a substrate, the apparatus including:
a rotary table provided in a vacuum container, configured to support a plurality of substrates on one surface side of the rotary table, and configured to rotate about a rotation center to revolve the substrates around the rotation center;

a separation region configured to separate an atmosphere in a first processing region to which a first processing gas to be adsorbed on the substrate is supplied and an atmosphere in a second processing region to which a second processing gas for reacting with the first processing gas to form a thin film on a surface of the substrate is supplied, and provided to be located between the first processing region and the second processing region in a rotation direction, the separation region including a separation gas supply configured to supply a separation gas and a main ceiling surface located on both sides of the separation gas supply in the rotation direction and configured to form a separation gas gap for the separation gas to flow between the rotary table and the main ceiling surface;

a central region including a central ceiling surface arranged around the rotation center to form a central gap communicating with the separation gas gap between the rotary table and the central ceiling surface to separate the atmosphere in the first processing region and the atmosphere in the second processing region;

a rotary shaft exhaust passage made of a tubular body and connected to the rotary table to rotate the rotary table about the rotation center, the rotary shaft exhaust passage having an exhaust path formed therein; and a ceiling surface side exhaust passage formed so as to vertically penetrate a member constituting the central region, wherein the method comprises:
exhausting the first processing gas discharged from the first processing region to one of the rotary shaft exhaust passage and the ceiling surface side exhaust passage; and
exhausting the second processing gas discharged from the second processing region to the other one of the rotary shaft exhaust passage and the ceiling surface side exhaust passage.

* * * * *